US006990613B2

(12) United States Patent
Doi et al.

(10) Patent No.: US 6,990,613 B2

(45) Date of Patent: Jan. 24, 2006

(54) TEST APPARATUS

(75) Inventors: Masaru Doi, Tokyo (JP); Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 57 days.

(21) Appl. No.: 10/840,018

(22) Filed: May 6, 2004

(65) Prior Publication Data

US 2004/0251914 A1 Dec. 16, 2004

Related U.S. Application Data

(63) Continuation of application No. PCT/JP02/11609, filed on Nov. 7, 2002.

(30) Foreign Application Priority Data

Nov. 8, 2001 (JP) ............................ 2001-342954

(51) Int. Cl.

*G06F 11/00* (2006.01)
*G11B 20/18* (2006.01)
*G01R 13/32* (2006.01)
*G01R 13/26* (2006.01)

(52) U.S. Cl. ...................... 714/700; 714/744; 324/765; 702/69

(58) Field of Classification Search ..................... None
See application file for complete search history.

(56) References Cited

U.S. PATENT DOCUMENTS

| | | | | |
|---|---|---|---|---|
| 6,377,065 | B1 * | 4/2002 | Le et al. | 324/765 |
| 6,479,983 | B1 * | 11/2002 | Ebiya | 324/158.1 |
| 6,549,000 | B2 * | 4/2003 | Ebiya | 324/158.1 |
| 2004/0208048 | A1 * | 10/2004 | Doi et al. | 365/145 |

FOREIGN PATENT DOCUMENTS

| | | |
|---|---|---|
| JP | 6-94796 | 4/1994 |
| JP | 6-324118 | 11/1994 |
| JP | 8-146103 | 6/1996 |
| JP | 10-288653 | 10/1998 |
| JP | 3066074 U | 11/1999 |
| JP | 2000-174838 | 6/2000 |
| JP | 2001-124836 | 5/2001 |

OTHER PUBLICATIONS

"A Dynamically Tracking Clock Distribution Chip with Skew Control" by Chengson et al. in 1990 Proceedings of the IEEE Custom Integrated Circuits Conference Publication Date: May 13-16, 1990 pages(s): 15.6/1-15.6/4 NSPEC Accession No.: 3863856.*

(Continued)

*Primary Examiner*—Albert Decady
*Assistant Examiner*—Cynthia Britt
(74) *Attorney, Agent, or Firm*—Osha - Liang LLP

(57) ABSTRACT

A test apparatus for testing an electronic device includes a pattern generating unit for generating a test pattern to test the electronic device, a reference clock generating unit for generating a reference clock, a timing generator for generating a timing signal, an output signal sampling circuit for sampling the output signal outputted by the electronic device in response to the test pattern at the timing based on the timing signal generated by the timing generator, wherein the timing generator includes a variable delay circuit unit for receiving, delaying and outputting the reference clock, and a delay control unit for controlling the delay amount of the variable delay circuit unit, and the delay control unit controls the delay amount based on the basic timing data and the variable delay amount which is smaller than the basic timing data.

9 Claims, 5 Drawing Sheets

OTHER PUBLICATIONS

Patent Abstracts of Japan, Publication No. 2001-124836 dated May 11, 2001, 1 pg.

Patent Abstracts of Japan, Publication No. 06-094796 dated Apr. 8, 1994, 1 pg.

Patent Abstracts of Japan, Publication No. 08-146103 dated Jun. 7, 1996, 1 pg.

Patent Abstracts of Japan, Publication No. 10-288653 dated Oct. 27, 1998, 1 pg.

Patent Abstracts of Japan, Publication No. 06-324118 dated Nov. 25, 1994, 1 pg.

Patent Abstracts of Japan, Publication No. 2000-174838 dated Jun. 23, 2000, 1 pg.

International Search Report issued in International Application No. PCT/JP02/11609 mailed Feb. 25, 2003, 3 pgs.

* cited by examiner

TEST APPARATUS

The present application is a continuation application of PCT/JP02/11609 filed on Nov. 7, 2002, which claims the benefit of, and priority from, a Japanese patent application No. 2001-342954 filed on Nov. 8, 2001, the entire contents of which are incorporated herein by reference for all purposes.

BACKGROUND OF THE INVENTION

1. Field of the Invention

The present invention relates to a test apparatus for testing the quality of an electronic device. More particularly, the present invention relates to a test apparatus for testing the quality of an electronic device wherein the internal clock of the electronic device has jitter.

2. Related Art

Recently, the trend towards a high speed electronic device such as a semiconductor device is considerable. For example, if there is jitter in the internal clock of a high speed memory device such as DDR-SDRAM, the jitter component is inevitably included in both the output signal of the device and the data strobe which is a clock based on the internal clock and used for the transfer of the output signal to the test apparatus.

However, since the conventional test apparatus judges the quality of the electronic device by one measurement, it is difficult to judge accurately due to the jitter component in both the output signal and the data strobe. In addition, if the conventional test apparatus samples the output signal outputted by the electronic device at different timing, it is necessary to store the phase data for a plurality of sampling timing signals to be produced in the test apparatus to shift the phases of the sampling timing signals by very small time intervals. Accompanying the recent trend towards a high speed semiconductor device, the search resolution of the sampling timing requires high resolution. Since the conventional test apparatus stores the phase data for a plurality of sampling timing signals to be produced in the test apparatus, it is necessary to store enormous amounts of phase data in the test apparatus to achieve high resolution. However, since it is impractical that a memory for storing such enormous amounts of phase data is provided in the test apparatus and besides storing all of the phase data of the sampling timing signals to be produced is nearly impossible, so it is difficult to test the electronic device highly accurately. Accordingly, it is desirable that a plurality of sampling timing signals whose phases are shifted by very small time intervals should be easily produced.

SUMMARY OF THE INVENTION

Accordingly, it is an object of the present invention to provide a test apparatus, which is capable of overcoming the above drawbacks accompanying the conventional art. The above and other objects can be achieved by combinations described in the independent claims. The dependent claims define further advantageous and exemplary combinations of the present invention.

In order to solve the problems above, according to the first aspect of the present invention, a test apparatus for testing an electronic device includes a reference clock generating unit for generating a reference clock, a pattern generating unit for generating a test pattern synchronously with the reference clock to test the electronic device, a waveform formatting unit for receiving the test pattern and inputting a formatted pattern which results from formatting the test pattern to the electronic device, a first timing generator for generating a timing signal, an output signal sampling circuit for sampling an output signal outputted by the electronic device in response to the test pattern at timing based on the timing signal generated by the first timing generator, and a judging unit for judging quality of the electronic device based on a sampling result of the output signal sampling circuit, wherein the first timing generator includes a first variable delay circuit unit for receiving, delaying and outputting the reference clock, and a first delay control unit for controlling a delay amount of the first variable delay circuit unit, and the first delay control unit includes a first basic timing data setting unit to which a first basic timing data is set in advance, a first multi-strobe resolution data setting unit to which a first multi-strobe resolution data is set in advance, a first multi-strobe data calculating unit for calculating a first multi-strobe data based on the first multi-strobe resolution data in response to the reference clock, and a first variable delay amount calculating unit for calculating the delay amount, by which the reference clock is to be delayed in the first variable delay circuit unit, based on the first basic timing data and first multi-strobe data.

The judging unit may include output signal jitter calculating means for calculating jitter of the output signal based on the sampling result of the output signal sampling circuit, and judge quality of the electronic device further based on the jitter of the output signal.

The first variable delay amount calculating unit may calculate the delay amount by adding the first multi-strobe data to the first basic timing data.

The first variable delay amount calculating unit may calculate the delay amount by subtracting the first multi-strobe data from the first basic timing data.

The first delay control unit may further include a first multi-strobe data storing unit for storing the first multi-strobe data calculated by the first multi-strobe data calculating unit, and a first multi-strobe resolution data adding unit for adding the first multi-strobe resolution data to the first multi-strobe data stored in the first multi-strobe data storing unit in response to the reference clock, the first multi-strobe data storing unit may anew store the first multi-strobe data to which the first multi-strobe resolution data has been added by the first multi-strobe resolution data adding unit, and the first variable delay amount calculating unit may calculate the delay amount, by which the reference clock is to be delayed in the first variable delay circuit unit, based on the first basic timing data and the first multi-strobe data stored in the first multi-strobe data storing unit.

The first delay control unit may further include means for setting the first multi-strobe data stored in the first multi-strobe data storing unit to be zero whenever a predetermined number of reference clocks are generated by the pattern generating unit.

The first delay control unit may further include means for setting a new first basic timing data in the first basic timing data setting unit whenever a predetermined number of reference clocks are generated by the pattern generating unit.

The test apparatus may further include means for setting a new first multi-strobe resolution data in the first multi-strobe resolution data setting unit, when a test cycle to test said electronic device is completed.

The test apparatus may further include a second timing generator for generating a timing signal and a data strobe sampling circuit for sampling an internal clock of the electronic device at the timing based on the timing signal generated by the second timing generator, wherein the electronic device may output the data strobe and the output signal in response to the internal clock, the second timing generator may include a second variable delay circuit unit for receiving, delaying and outputting the reference clock, and a second delay control unit for controlling a delay amount of the second variable delay circuit unit, the second delay control unit may include a second basic timing data setting unit to which a second basic timing data is set in advance, a second multi-strobe resolution data setting unit to which a second multi-strobe resolution data is set in advance, a second multi-strobe data calculating unit for calculating a second multi-strobe data based on the second multi-strobe resolution data in response to the reference clock, and a second variable delay amount calculating unit for calculating the delay amount, by which the reference clock is to be delayed in the second variable delay circuit unit, based on the second basic timing data and second multi-strobe data, and the judging unit may judge quality of the electronic device further based on a sampling result of the data strobe sampling circuit.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
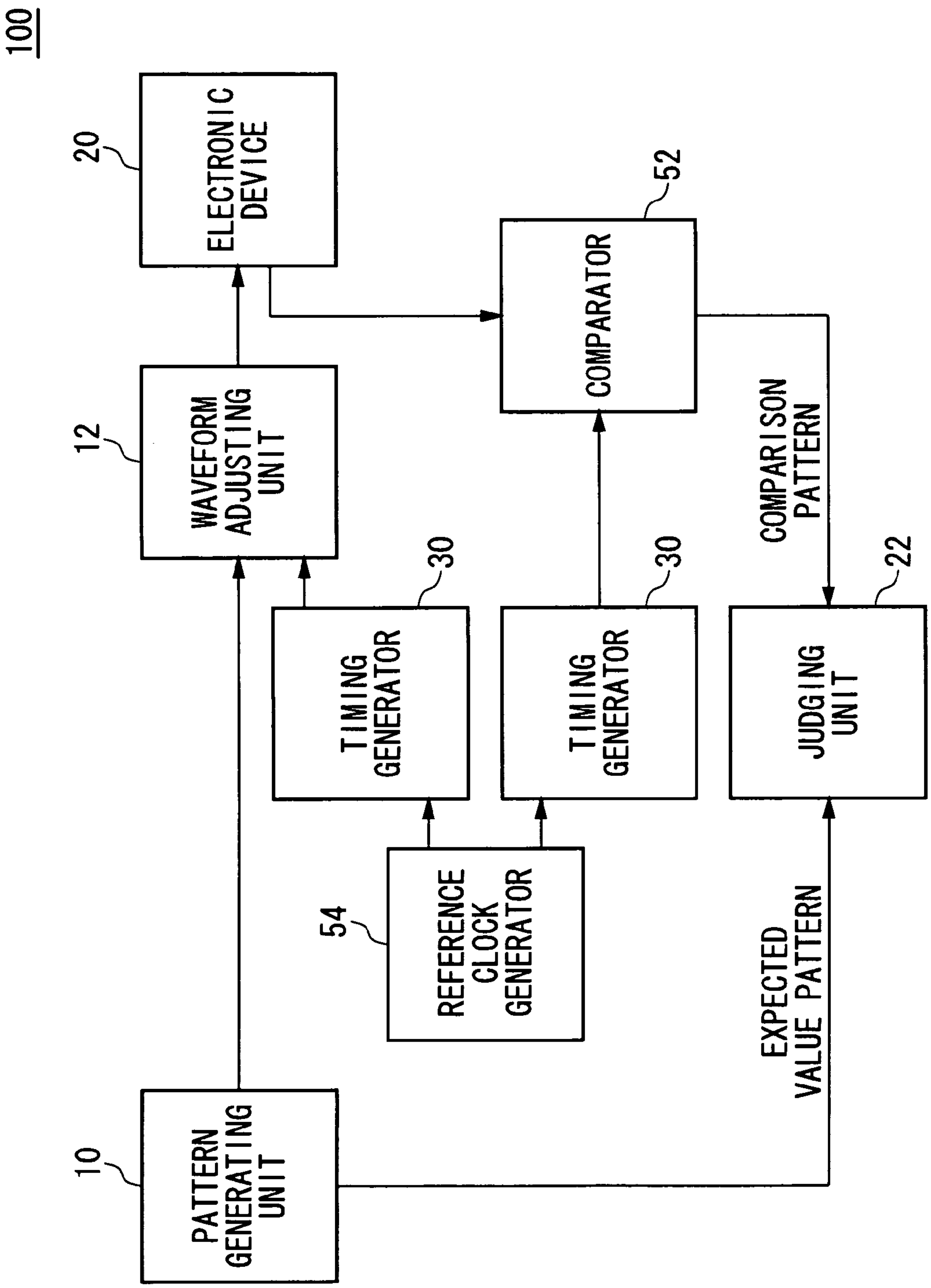
FIG. 1 shows an example of the configuration of a test apparatus 100 according to the present invention.

FIG. 1 shows an example of the configuration of a test apparatus 100 according to the present invention. The test apparatus 100 includes a reference clock generating unit 54 for generating a reference clock, a pattern generating unit 10 for generating a test pattern synchronously with the reference clock, a timing generator 30 for generating a timing signal based on the reference clock, a waveform formatting unit 12 for generating a formatted pattern which results from formatting the test pattern and inputting the formatted pattern to the electronic device 20 at the timing based on the timing signal generated by the timing generator 30, a comparator 52 for obtaining a comparison pattern which is the pattern of an output signal outputted by the electronic device 20 at the timing based on the timing signal generated by the timing generator 30, and a judging unit 22 for judging the quality of the electronic device 20 based on the comparison pattern and the expected value pattern.

The pattern generating unit 10 generates the test pattern for the test of the electronic device 20 and the expected value pattern outputted by the electronic device 20 when the test pattern is inputted into the electronic device 20. The wave form formatting unit 12 generates the formatted pattern which results from formatting the test pattern and inputs the formatted pattern to the electronic device 20 based on the timing signal generated by the timing generator 30. For example, the waveform formatting unit 12 delays the formatted pattern based on the timing signal generated by the timing generator 30 and inputs it to the electronic device 20. The comparator 52 obtains the value of the output signal outputted by the electronic device 20 based on the inputted formatted pattern based on the timing signal generated by the timing generator 30. The timing generator 30 generates a plurality of timing signals, and the comparator obtains the pattern of the output signal based on the timing signals generated by the timing generator 30 and generates the comparison pattern. The judging unit 22 judges the quality of the electronic device 20 based on the comparison pattern and the expected value pattern.

In this embodiment, the timing generator 30 generates a plurality of timing signals. For example, a plurality of clocks are inputted from the reference clock generating unit 54 to the timing generator 30, and the timing generator 30 delays a different delay amount clock whenever the clock is inputted and inputs it to the waveform formatting unit 12 or the comparator 52. For example, the timing generator 30 generates a multi-strobe by gradually increasing or decreasing the delay amount which results from delaying the clock whenever the clock is inputted. The timing generator 30 for supplying the timing signal to the waveform formatting unit 12 and the timing generator 30 for supplying the timing signal to the comparator 52 may have the same function and configuration. The timing generator 30 may include means for setting the resolution of the multi-strobe so as to calculate the delay amount based on the determined resolution of the multi-strobe whenever the clock is inputted. For example, the timing generator 30 may calculate the delay amount to which the resolution of the multi-strobe is added whenever the clock is inputted and delays and outputs the inputted clock based on the calculated delay amount. According to the test apparatus 100 described in this embodiment, since the delay amount is calculated based on the determined resolution of the multi-strobe, it is unnecessary to store the setting value of the timing for each multi-strobe to be generated by the timing generator 30, and the deficiency in the storage capacity of the test apparatus 100 can be solved. Hereinafter, the configuration and operation of the timing generator 30 will be described.

Figure 2:
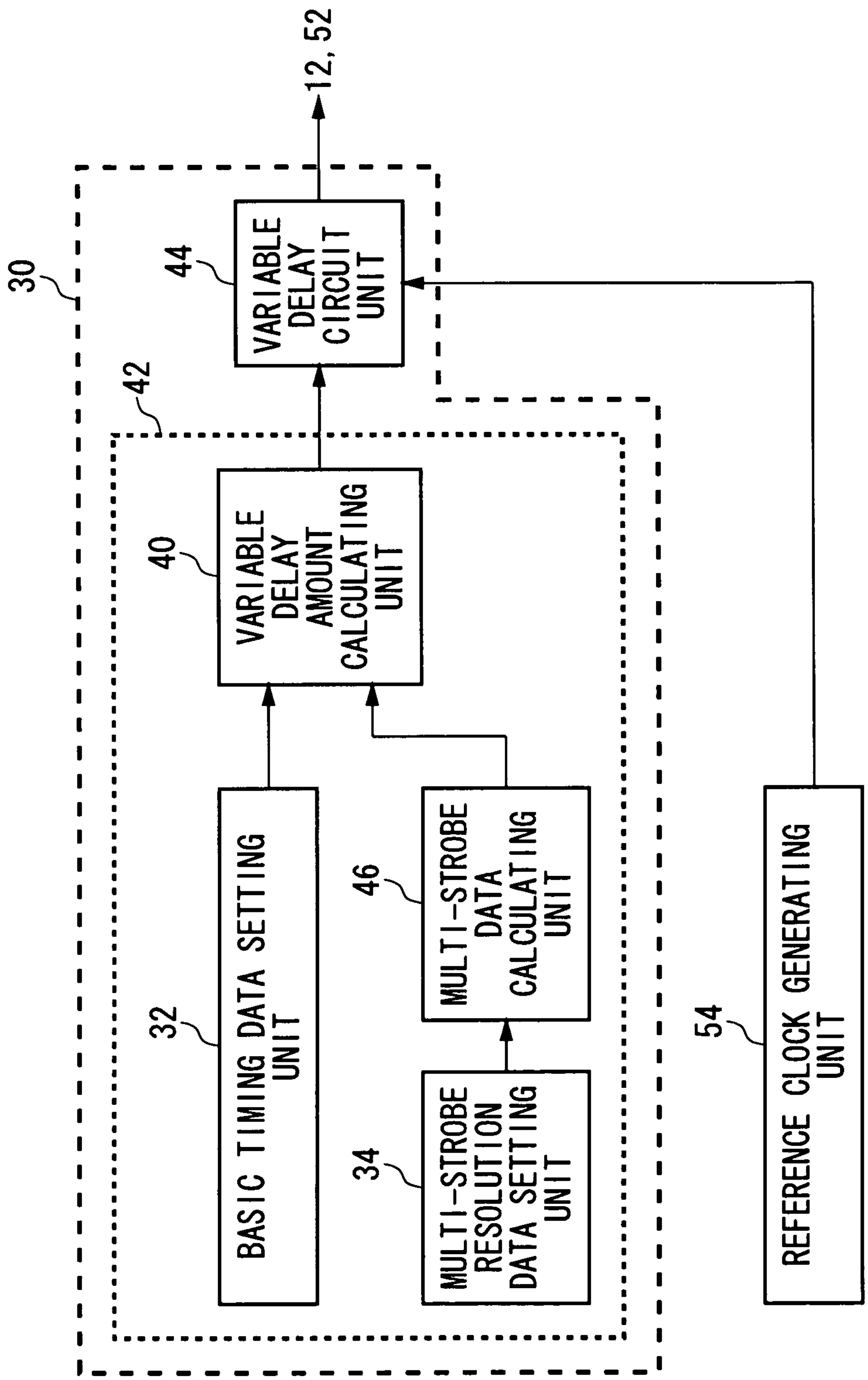
FIG. 2 is a block diagram showing an example of the configuration of a timing generator 30 of this embodiment.

FIG. 2 is a block diagram showing an example of the configuration of the timing generator 30 of this embodiment. The timing generator 30 includes a variable delay circuit unit 44 and a delay control unit 42. The variable delay circuit unit 44 receives the reference clock, and delays and outputs it to the waveform formatting unit 12 or the comparator 52. The delay control unit 42 controls the delay amount of the variable delay circuit unit 44.

The delay control unit 42 includes a basic timing data setting unit 32 to which the basic timing data is set in advance, a multi-strobe resolution data setting unit 34 to which the multi-strobe resolution data is set in advance, a multi-strobe data calculating unit 46 for calculating the multi-strobe data based on the multi-strobe resolution data in response to the reference clock, and a first variable delay amount calculating unit 40 for calculating the delay amount by which the reference clock should be delayed by the variable delay circuit unit 44 based on the basic timing data and the multi-strobe data.

The multi-strobe data calculating unit 46 preferably calculates the multi-strobe data synchronously with the reference clock. In addition, the multi-strobe data calculating unit 46 may calculate the multi-strobe data whenever the reference clock generating unit 54 generates the reference clock. In this case, it is preferable that the output signal and the reference clock should be synchronized. The variable delay amount calculating unit 40 may control the delay amount by which the reference clock is to be delayed by the variable delay circuit unit 44 based on the multi-strobe data calculated in response to the reference clock and the basic timing data. In addition, the multi-strobe data calculating unit 46 preferably calculates the multi-strobe data to which the approximately equal delay amount is added whenever the reference clock generating unit 54 generates the reference clock. For example, the multi-strobe data calculating unit 46 preferably calculates the multi-strobe data to which the multi-strobe resolution data is added whenever the reference clock generating unit 54 generates the reference clock.

The variable delay amount calculating unit 40 may calculate the delay amount which results from adding the multi-strobe data to the basic timing data. And the variable delay amount calculating unit 40 may calculate the delay amount which results from subtracting the multi-strobe data from the basic timing data. In addition, the delay control unit 42 may further include means for determining whether the variable delay amount calculating unit 40 calculates the delay amount which results from adding the multi-strobe data to the basic timing data or subtracting the multi-strobe data from the basic timing data. Since the calculation method of the variable delay amount calculating unit 40 is selected, the change direction of the phase of the timing generated by the timing generator 30 can be controlled. In other words, whether the phase of the timing is shifted in the positive or negative direction of the time axis with regard to the output signal outputted by the electronic device 20 can be selected so as to generate the timing signal.

Figure 3:
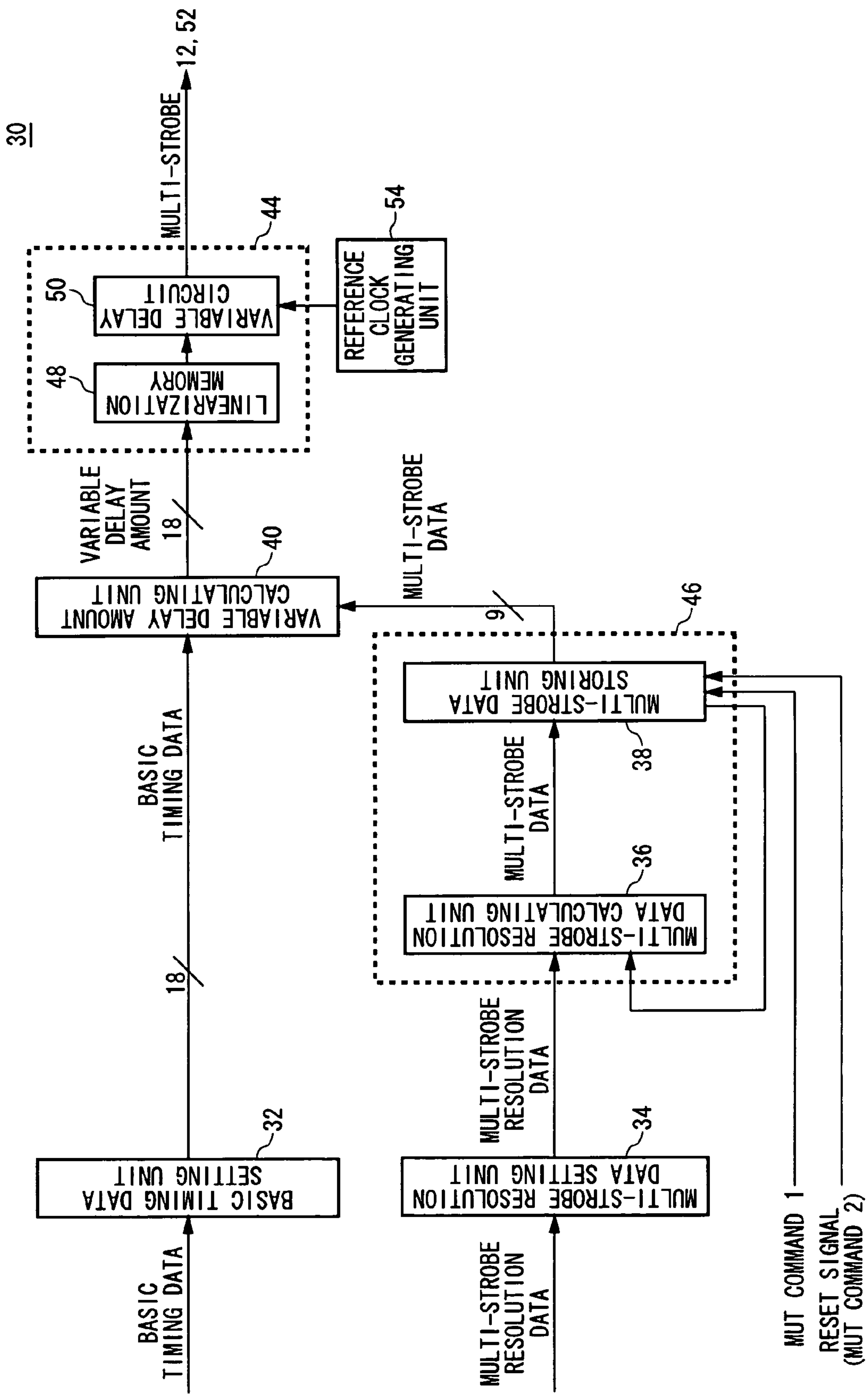
FIG. 3 shows an example of the configuration of the timing generator 30.

FIG. 3 shows an example of the configuration of the timing generator 30. In FIG. 3 matters given by the same symbols as those in FIG. 2 may have the same function and configuration with those in FIG. 2. The timing generator 30 includes a variable delay circuit unit 44 and a delay control unit 42 (cf. FIG. 2). The variable delay circuit unit 44 includes a variable delay circuit 50 and a linearization memory 48. The variable delay circuit 50 may include a plurality of delay elements so that it generates the delay amount by any combination of the delay elements. The linearization memory 48 selects the combination of the delay elements of the variable delay circuit 50 based on the delay amount to be delayed by the variable delay circuit 50. The linearization memory 48 may include a memory for storing the signal transmission route of the variable delay circuit 50 based on the delay amount used by the variable delay circuit 50. The linearization memory 48 receives a trigger to control the operation of the linearization memory 48. The trigger may be the reference clock.

The delay control unit 42 includes a basic timing data setting unit 32, a multi-strobe resolution data setting unit 34, a variable delay amount calculating unit 40, a multi-strobe data calculating unit 46, a multi-strobe resolution data adding unit 36, and a multi-strobe data storing unit 38. In this embodiment, the multi-strobe data calculating unit 46 may include a multi-strobe resolution data adding unit 36 and a multi-strobe data storing unit 38. In this embodiment, the delay control unit 42 may include a digital circuit for controlling the delay amount of the variable delay circuit unit 40 by digital signals. In this embodiment, the delay control unit 42 controls the delay amount of the variable delay circuit unit 40 by 18-bit digital signals.

The multi-strobe resolution data setting unit 34 sets the multi-strobe resolution data. The variable delay circuit 50 preferably includes delay elements which have a delay amount approximately the same as the multi-strobe resolution data. The multi-strobe resolution data setting unit 34 may be a register for storing a digital signal. And the multi-strobe resolution data setting unit 34 receives a trigger for controlling the operation of the multi-strobe resolution data setting unit 34. The trigger may be the reference clock.

The basic timing data setting unit 32 sets the basic timing data. The basic timing data setting unit 32 outputs the basic timing data to the variable delay amount calculating unit 40 in the form of 18-bit digital signals. The basic timing data setting unit 32 may be a register for storing a digital signal. And the basic timing data setting unit 32 receives a trigger for controlling the operation of the multi-strobe resolution data setting unit 34. The trigger may be the reference clock.

The multi-strobe resolution data setting unit 34 supplies the multi-strobe resolution data to the multi-strobe resolution data adding unit 36. The multi-strobe resolution data adding unit 36 adds the multi-strobe resolution data to the multi-strobe data stored in the multi-strobe data storing unit 38 in response to the reference clock, and stores it in the multi-strobe data storing unit 38 as new multi-strobe resolution data. The multi-strobe data storing unit 38 stores the multi-strobe data calculated by the multi-strobe resolution data adding unit 36 of the multi-strobe data calculating unit 46. The multi-strobe resolution data adding unit 36 may be an adder circuit which includes a logic circuit for adding digital signals. In the initial state, the multi-strobe data storing unit 38 may be given a desired value as the initial value of the multi-strobe data. In this embodiment, the multi-strobe data storing unit 38 is given zero as the initial value of the multi-strobe data.

The multi-strobe data calculating unit 46 outputs the multi-strobe data stored in the multi-strobe data storing unit 38 to the variable delay amount calculating unit 40 in the form of 9-bit digital signals. The multi-strobe data storing unit 38 may be a register for storing a digital signal. And the multi-strobe data storing unit 38 receives a trigger for controlling the operation of the multi-strobe data storing unit 38. The trigger may be the reference clock. According to the multi-strobe data calculating unit 46 as above, it is possible to easily generate a delay setting value which has increased as much as the multi-strobe resolution data whenever the electronic device 20 outputs its output signal.

In addition, the pattern generating unit 10 (cf. FIG. 1) may include means for outputting a reset signal (MUT COMMAND 2) to set the multi-strobe data stored in the delay amount to be zero or the initial value based on the test pattern to test the electronic device 20. And the pattern generating unit 10 (cf. FIG. 1) may include means for setting new basic timing data in the basic timing data setting unit 32 at predetermined timing based on the test pattern to test the electronic device 20. In addition, the test apparatus 100 may include means for setting new basic timing data in the basic timing data setting unit 32 at predetermined timing based on the test pattern to test the electronic device 20. The means for setting the new basic timing data in the basic timing data setting unit 32 preferably sets the new basic timing data in the basic timing data setting unit 32 when the test cycle for the test of the electronic device 20 is completed.

Moreover, the test apparatus 100 may include means for setting new multi-strobe resolution data in the multi-strobe resolution data setting unit 34. The means for setting the new multi-strobe resolution data in the multi-strobe resolution data setting unit 34 preferably sets the new multi-strobe resolution data in the multi-strobe resolution data setting unit 34 when the test cycle for the test of the electronic device 20 is completed.

In addition, the pattern generating unit 10 (cf. FIG. 1) may include means for inputting a signal (MUT COMMAND 1), which makes the variable slight delay calculating unit 46 start to add the multi-strobe resolution data, to the multi-strobe data calculating unit 46. When the multi-strobe data calculating unit 46 receives the signal for the start of addition of the multi-strobe resolution data, it starts the feedback of the multi-strobe data from the multi-strobe data storing unit 38 to the multi-strobe resolution data adding unit 36.

The variable delay amount calculating unit 40 calculates the delay amount by which the reference clock is to be delayed in the variable delay circuit unit 44 based on the basic timing data and the multi-strobe data stored by the multi-strobe data storing unit 38. In this embodiment, the variable delay amount calculating unit 40 receives the 18-bit basic timing data and the 9-bit multi-strobe data, and adds the 9 bits of the multi-strobe data to the low-order 9 bits of the basic timing data. In another embodiment, the variable delay amount calculating unit 40 may subtract the 9 bits of the multi-strobe data from the low-order 9 bits of the basic timing data. And the delay control unit 42 may further include selecting means for selecting either addition or subtraction in the variable delay amount calculating unit 40. The variable delay amount calculating unit 40 may include an adder logic circuit for performing addition of digital signals and a subtractor logic circuit for performing subtraction of digital signals. And the variable delay amount calculating unit 40 may include a selecting unit for selecting either the adder or subtractor logic circuit. Moreover, the elements included in the timing generator 30 may operate based on the reference clock.

Figure 4:
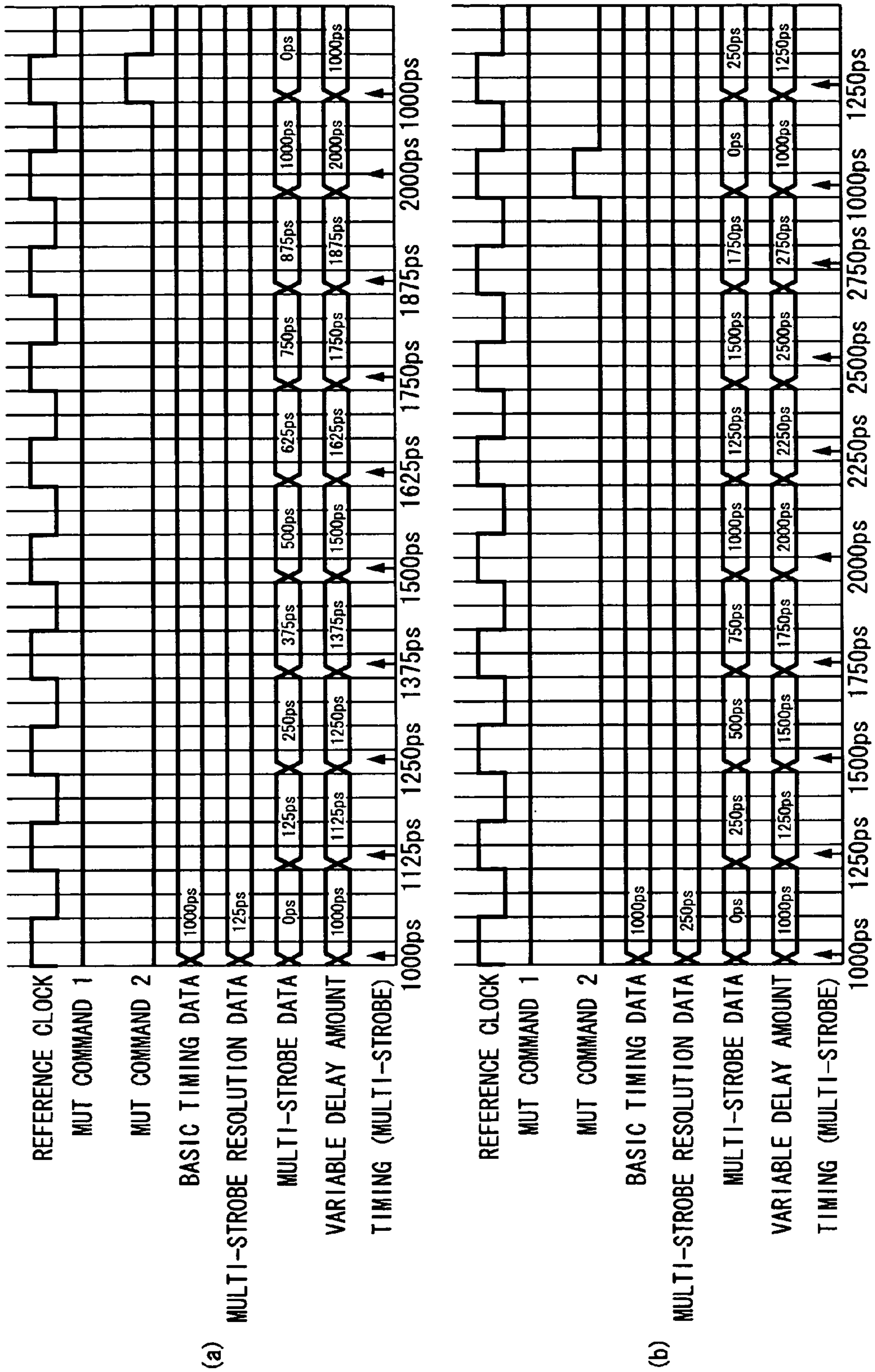
FIG. 4 is a timing chart showing an example of the operation of the timing generator 30.

FIG. 4 is a timing chart showing an example of the operation of the timing generator 30. In FIG. 4, the horizontal axis represents time, and one scale represents 2 ns (nano seconds). The reference clock row represents the reference clock generated by the reference clock generating unit 54, and the timing (the multi-strobe) row represents the timing (the multi-strobe) based on the timing signal generated by the timing generator 30. And the basic timing data row represents the basic timing data set by the basic timing data setting unit 32, the multi-strobe resolution data represents row the multi-strobe resolution data set by the multi-strobe resolution data setting unit 34, the multi-strobe data row represents the multi-strobe data calculated by the multi-strobe data calculating unit 46, and the variable delay amount row represents the variable delay amount calculated by the variable delay amount calculating unit 40 respectively. And the numbers such as 1000 ps (pico seconds), 1125 ps, . . . shown below the timing row represent the phase difference between the timing (the multi-strobe) based on the timing signal generated by the timing generator 30 and the reference clock.

FIG. 4(*a*) shows an example where the basic timing data is set to be 1000 ps, the multi-strobe resolution data to be 125 ps, and the multi-strobe data to be 0 ps as the initial state. When MUT COMMAND 1 which is the start signal becomes on, the multi-strobe data calculating unit 46 starts to add the multi-strobe resolution data to the multi-strobe data. After MUT COMMAND 1 is on, the multi-strobe data calculating unit 46 starts to add the multi-strobe resolution data to the multi-strobe data in response to the reference clock, and the multi-strobe data becomes the value shown in the multi-strobe data row in FIG. 4. The variable delay amount calculated by the variable delay amount calculating unit 40 in response to the reference clock becomes the value shown in the variable delay amount row in FIG. 4, where the multi-strobe data has been added to the basic timing data. The timing generated by the timing generator 30 in response to the reference clock, as shown in FIG. 4, becomes the value which results from delaying the rise of the reference clock as much as the variable delay amount. In this embodiment, since the delay amount where the multi-strobe data has been added to the basic timing data is taken as the variable delay amount, with regard to the timing generated by the timing generator 30 in response to the reference clock increases, the delay amount to the rise of the reference clock increases by 125 ps in FIG. 4(*a*) and 250 ps in FIG. 4(*b*).

The multi-strobe data increases by 125 ps which is the multi-strobe resolution data in response to the reference clock, until MUT COMMAND 2 which is the reset signal becomes on. When MUT COMMAND 2 becomes on, the multi-strobe data is set to be 0 ps. MUT COMMAND 2 becomes on when the reference clock occurs predetermined times. The test precision and time for the test of the test apparatus 100 can be formatted by the number of the predetermined times and the setting value of the multi-strobe resolution data. The multi-strobe resolution data represents the resolution of the phase change of the timing based on the timing signal generated by the timing generator 30. In other words, by changing the multi-strobe resolution data, the timing of predetermined resolution of the phase change can be generated. And the test apparatus 100 may include means for setting new multi-strobe resolution data in the multi-strobe resolution data setting unit 34. The new multi-strobe resolution data is set in the multi-strobe resolution data setting unit 34 when the test cycle for the test of the electronic device 20 is completed. For example, when the test cycle shown in FIG. 4(*a*) is completed, the means may set the new multi-strobe resolution data as shown in FIG. 4(*b*) and the test apparatus 100 may start a new test cycle.

Figure 5:
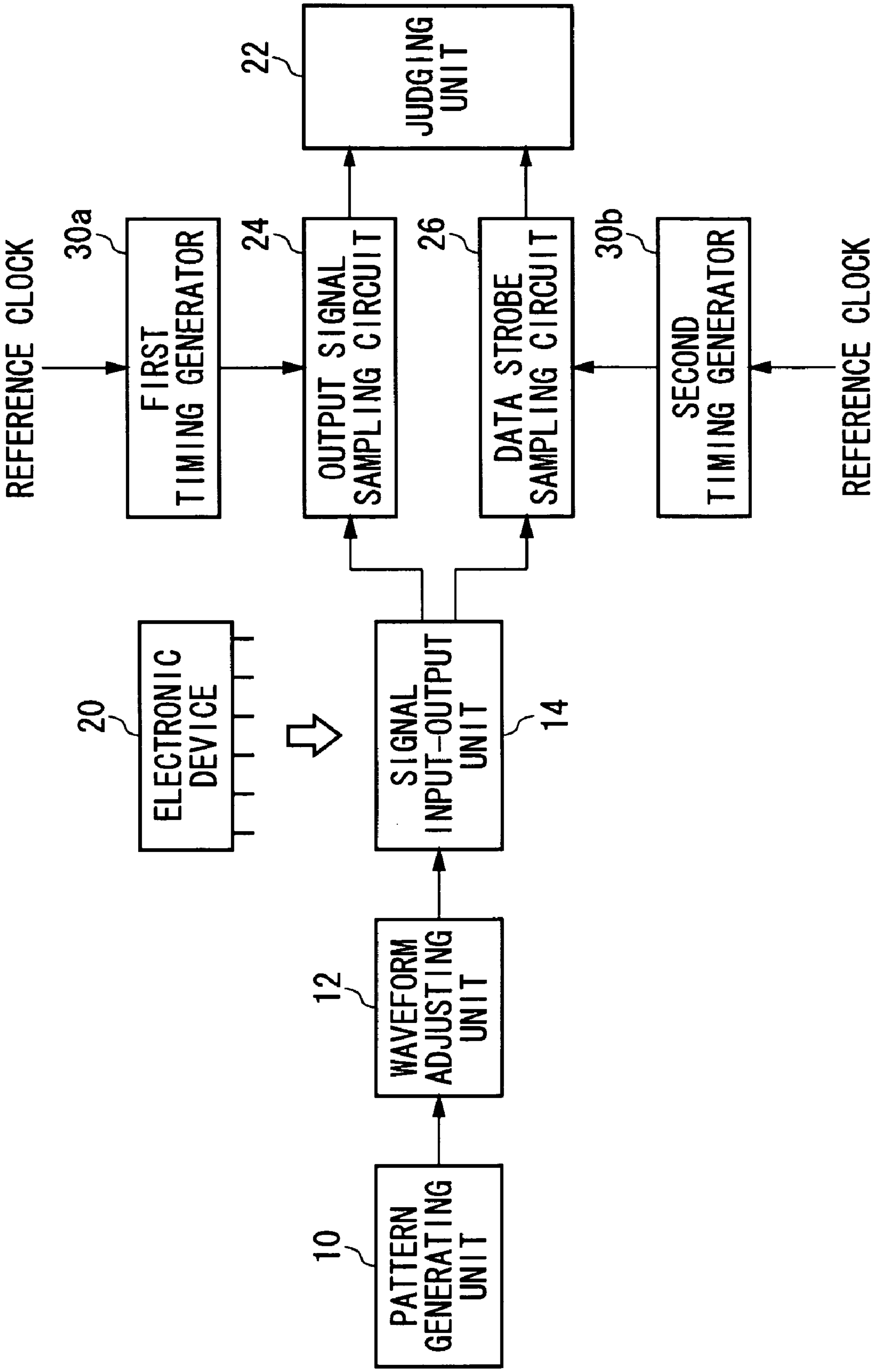
FIG. 5 shows another example of the configuration of the test apparatus 100 according to this invention.

FIG. 5 shows another example of the configuration of the test apparatus 100 according to this invention. Matters in FIG. 5 given the same symbols as those in FIG. 1 may have the same or similar function and configuration. The test apparatus 100 receives the output signal from the electronic device 20 in response to the data strobe which is a clock based on the internal clock of the electronic device 20. Here, the data strobe is a signal which is used for an external apparatus to receive the output signal. For example, the data strobe is the signal which determines the timing for the transfer of the output signal.

The test apparatus 100 includes a reference clock generating unit 54 for generating the reference clock, a pattern generating unit 10 for generating the test pattern synchronously with the reference clock, a waveform formatting unit 12 for formatting the test pattern, a signal input-output unit 14 for sending and/or receiving signals with the electronic device 20, a first timing generator 30*a* for generating the timing signal, a second timing generator 30*b* for generating the timing signal, an output signal sampling circuit 24 for sampling the output signal outputted by the electronic device 20, a data strobe sampling circuit 26 for sampling the data strobe of the electronic device 20, and a judging unit 22 for judging the quality of the electronic device 20.

The pattern generating unit 10 generates the test pattern for the test of the electronic device 20 with the reference clock, and inputs it to the electronic device 20 via the waveform formatting unit 12 and the signal input-output unit 14. The reference clock generating unit 54 generates the reference clock, and supplies it to the first and second timing generators 30_a_ and 30_b_. The reference clock generating unit 54 preferably generates the reference clock synchronously with the output signal outputted by the electronic device 20 in response to the test pattern. The waveform formatting unit 12 formats the test pattern generated by the pattern generating unit 10. For example, the waveform formatting unit 12 inputs the formatted pattern which results from delaying the test pattern generated by the pattern generating unit 10 as much as a desired time to the signal input-output unit 14. The signal input-output unit 14 is electrically coupled to the electronic device 20, and inputs the formatted pattern received from the waveform formatting unit 12 to the electronic device 20. And the signal input-output unit 14 receives the output signal outputted by the electronic device 20 in response to the formatted pattern, and outputs it to the output signal sampling circuit 24. In addition, the signal input-output unit 14 receives the data strobe and outputs it to the data strobe sampling circuit 26, so that a flip-flop in the test apparatus 100 receives the output signal of the electronic device 20.

The first timing generator 30_a_ supplies a plurality of timing signals whose phases have been shifted by very small time intervals to the output signal sampling circuit 24 in response to the output signal of the electronic device 20. The output signal sampling circuit 24 samples the output signals outputted by the electronic device 20 in response to the test pattern at the timing based on the timing signals generated by the first timing generator 30_a_. The judging unit 22 may include output signal jitter calculating means for calculating the jitter of the output signal of the electronic device 20. The output signal jitter calculating means calculates the jitter of the output signal outputted by the electronic device 20 based on the sampling result of the output signal sampling circuit 24.

The second timing generator 30_b_ supplies timing signals whose phases have been shifted by very small time intervals to the data strobe sampling circuit 26 in response to the data strobe based on the internal clock of the electronic device 20. The data strobe sampling circuit 26 receives the data strobe of the electronic device 20, and performs sampling at the timing based on the timing signals generated by the second timing generator 30_b_. The judging unit 22 may include data strobe jitter calculating means for calculating the jitter of the data strobe based on the internal clock of the electronic device 20. The data strobe jitter calculating means calculates the jitter of the data strobe based on the sampling result of the data strobe sampling circuit 26. The first and second timing generators 30_a_ and 30_b_ have the same function and configuration as the timing generator 30 described in connection with FIGS. 1 to 4.

The judging unit 22 judges the quality of the electronic device 20 based on at least one of the sampling results of the output signal sampling circuit 24 and the data strobe sampling circuit 26. And the judging unit 22 may judge the quality of the electronic device 20 based on at least one of the sampling results of the output signal sampling circuit 24 and the data strobe sampling circuit 26 and the jitters of the output signal and the data strobe. For example, the judging unit 22 may judges the quality of the electronic device 20 based on the jitter of the output signal calculated by the output signal jitter calculating means and the jitter of the data strobe calculated by the data strobe jitter calculating means. In other words, the judging unit 22 may compare a jitter reference value which is given in advance with the jitters of the output signal and the data strobe, and judge the quality of the electronic device 20, In this case, the output signal sampling circuit 24 preferably samples the output signals of the electronic device 20 a plurality of times at the timing based on each of the timing signals whose received phases are different. The output signal jitter calculating means may compare the plurality of sampling results at the timing based on each of the timing signals whose phases are different with the reference value which is given in advance, and calculate the jitter of the output signal of the electronic device 20 based on how many times the sampling results at the timing based on each of the timing signals whose phases are different are more than the reference value. And the data strobe sampling circuit 26 preferably samples the data strobe a plurality of times at the timing based on each of the timing signals whose received phases are different. The data strobe jitter calculating means may compare the plurality of sampling results at the timing based on each of the timing signals whose phases are different with the reference value which is given in advance, and calculate the jitter of the data strobe based on how many times the sampling results at the timing based on each of the timing signals whose phases are different are more than the reference value. And the judging unit 22 is given a plurality of different jitter reference values, so that it may compare the jitter reference values with the calculated jitter and judge the quality of the electronic device 20 in response to each of the jitter reference values. In other words, the judging unit 22 may judge the quality of the electronic device 20 based on the calculated jitter.

In another embodiment, the judging unit 22 may judge the quality of the electronic device 20 based on the sampling results of the output signal sampling circuit 24 and the data strobe sampling circuit 26. For example, the judging unit 22 may judge the quality of the electronic device 20 based on the timing at which the output signal of the electronic device 20 becomes the reference value of the output signal given in advance and the timing at which the data strobe becomes the reference value of the data strobe given in advance. The judging unit 22 may judge the quality of the electronic device 20 based on the relation between the timing at which the output signal of the electronic device 20 becomes the reference value of the output signal given in advance and the timing at which the data strobe becomes the reference value of the data strobe given in advance.

The first timing generator 30_a_ includes a first variable delay circuit unit 44_a_ and a first delay control unit 42_a_, and the second timing generator 30_b_ includes a second variable delay circuit unit 44_b_ and a second delay control unit 42_b_. The first and second variable delay circuit units 44_a_ and 44_b_ may have the same function and configuration as the variable delay circuit unit 44 described in connection with FIGS. 2 to 4. Moreover, the first and second delay control units 42_a_ and 42_b_ may have the same function and configuration as the delay control unit 42 described in connection with FIGS. 2 to 4.

According to the test apparatus 100 as above, it is possible to easily generate a plurality of timing signals whose phases are shifted by very small time intervals in response to the output signal or the data strobe based on the internal clock of the electronic device 20. Therefore, it is possible to easily sample the output signal or the data strobe of the electronic device 20 at the timing based on the plurality of timing signals whose phases are different. In addition, since it is unnecessary to have the phase data of the sampling timing signals whose phases are different for each of the sampling timing signals, the load of the storage capacity of the test apparatus 100 can be reduced.

Although the present invention has been described by way of exemplary embodiments, it should be understood that those skilled in the art might make many changes and substitutions without departing from the spirit and the scope of the present invention, which is defined only by the appended claims.

As obvious from the description above, according to the test apparatus 100 of the present invention, it is possible to easily generate a plurality of timing signals whose phases are shifted by very small time intervals and to easily sample the output signal or the data strobe of the electronic device 20 at the timing based on a plurality of timing signals whose phases are different.

What is claimed is:

1. A test apparatus for testing an electronic device, comprising:

a reference clock generating unit for generating a reference clock;

a pattern generating unit for generating a test pattern synchronously with said reference clock to test said electronic device;

a waveform formatting unit for receiving said test pattern and inputting a formatted pattern which results from formatting said test pattern to said electronic device;

a first timing generator for generating a timing signal;

an output signal sampling circuit for sampling an output signal outputted by said electronic device in response to said test pattern at timing based on said timing signal generated by said first timing generator; and a judging unit for judging quality of said electronic device based on a sampling result of said output signal sampling circuit, wherein said first timing generator comprises:

a first variable delay circuit unit for receiving, delaying and outputting said reference clock; and a first delay control unit for controlling a delay amount of said first variable delay circuit unit, and said first delay control unit comprises:

a first basic timing data setting unit to which a first basic timing data is set in advance;

a first multi-strobe resolution data setting unit to which a first multi-strobe resolution data is set in advance;

a first multi-strobe data calculating unit for calculating a first multi-strobe data based on said first multi-strobe resolution data in response to said reference clock; and a first variable delay amount calculating unit for calculating said delay amount, by which said reference clock is to be delayed in said first variable delay circuit unit, based on said first basic timing data and first multi-strobe data.

2. A test apparatus as claimed in claim 1, wherein said judging unit comprises output signal jitter calculating means for calculating jitter of said output signal based on said sampling result of said output signal sampling circuit, and judges quality of said electronic device further based on said jitter of said output signal.

3. A test apparatus as claimed in claim 1, wherein said first variable delay amount calculating unit calculates said delay amount by adding said first multi-strobe data to said first basic timing data.

4. A test apparatus as claimed in claim 1, wherein said first variable delay amount calculating unit calculates said delay amount by subtracting said first multi-strobe data from said first basic timing data.

5. A test apparatus as claimed in claim 1, wherein said first delay control unit further comprises:

a first multi-strobe data storing unit for storing said first multi-strobe data calculated by said first multi-strobe data calculating unit; and a first multi-strobe resolution data adding unit for adding said first multi-strobe resolution data to said first multi-strobe data stored in said first multi-strobe data storing unit in response to said reference clock, said first multi-strobe data storing unit stores anew said first multi-strobe data to which said first multi-strobe resolution data has been added by said first multi-strobe resolution data adding unit, and said first variable delay amount calculating unit calculates said delay amount, by which said reference clock is to be delayed in said first variable delay circuit unit, based on said first basic timing data and said first multi-strobe data stored in said first multi-strobe data storing unit.

6. A test apparatus as claimed in claim 1, wherein said pattern generating unit further comprises means for setting said first multi-strobe data stored in said first multi-strobe data storing unit to be zero based on said test pattern generated by said pattern generating unit.

7. A test apparatus as claimed in claim 1, further comprising means for setting a new first basic timing data in said first basic timing data setting unit, when a test cycle to test said electronic device is completed.

8. A test apparatus as claimed in claim 1, wherein said pattern generating unit further comprises means for setting a new first multi-strobe resolution data in said first multi-strobe resolution data setting unit based on said test pattern generated by said pattern generating unit.

9. A test apparatus as claimed in claim 1, further comprising:

a second timing generator for generating a timing signal; and a data strobe sampling circuit for sampling a data strobe at timing based on said timing signal generated by said second timing generator, wherein said electronic device outputs said output signal and said data strobe which is for an external apparatus to receive said output signal in response to an internal clock, said second timing generator comprises:

a second variable delay circuit unit for receiving, delaying and outputting said reference clock; and a second delay control unit for controlling a delay amount of said second variable delay circuit unit, said second delay control unit comprises:

a second basic timing data setting unit to which a second basic timing data is set in advance;

a second multi-strobe resolution data setting unit to which a second multi-strobe resolution data is set in advance;

a second multi-strobe data calculating unit for calculating a second multi-strobe data based on said second multi-strobe resolution data in response to said reference clock; and a second variable delay amount calculating unit for calculating said delay amount, by which said reference clock is to be delayed in said second variable delay circuit unit, based on said second basic timing data and second multi-strobe data, and said judging unit judges quality of said electronic device further based on a sampling result of said data strobe sampling circuit.

* * * * *